(12) United States Patent
Lin et al.

(10) Patent No.: US 7,199,742 B2
(45) Date of Patent: Apr. 3, 2007

(54) DIGITAL-TO-ANALOG CONVERTER AND RELATED LEVEL SHIFTER THEREOF

(75) Inventors: Tzu-Chao Lin, Kao-Hsiung (TW); Yuan-Hui Chen, Hsin-Chu (TW); Hai-Thanh Nguyen, Sunnyvale, CA (US)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/161,302

(22) Filed: Jul. 29, 2005

(65) Prior Publication Data

US 2007/0024479 A1  Feb. 1, 2007

(51) Int. Cl.
*H03M 1/66* (2006.01)

(52) U.S. Cl. ............. 341/144; 341/136; 326/80; 326/81; 327/333

(58) Field of Classification Search .......... 341/136, 341/144–154; 327/333, 544; 326/63, 66, 326/68, 80, 81
See application file for complete search history.

(56) References Cited

U.S. PATENT DOCUMENTS 4,486,670 A * 12/1984 Chan et al. .............. 326/81
5,742,183 A * 4/1998 Kuroda .................... 326/81
6,407,579 B1 * 6/2002 Goswick .................. 326/81
6,489,828 B1 * 12/2002 Wang et al. ............. 327/333
6,559,785 B2 * 5/2003 Kuttner ................... 341/155
6,600,357 B1 * 7/2003 Kirihara .................. 327/333
6,967,609 B1 * 11/2005 Bicakci et al. .......... 341/144
7,061,299 B2 * 6/2006 Khan et al. .............. 327/333
7,064,699 B2 * 6/2006 Sekiguchi ................ 341/144

* cited by examiner

*Primary Examiner*—Linh V. Nguyen
(74) *Attorney, Agent, or Firm*—Winston Hsu

(57) ABSTRACT

A digital-to-analog converter has a plurality of current cells. Each of the current cells has a level shifter and a current source. The level shifter connects to a first power terminal and a second power terminal to convert a first input signal and a second input signal into a first output signal and a second output signal. The current source has two cascaded MOS transistors connected to the first power terminal in series, a first MOS switch having a gate for receiving the first output signal, and a second MOS switch having a gate for receiving the second output signal. A voltage level of the first power terminal is greater than a voltage level of the second power terminal. When one of the current cells operates, one of the first MOS switch and the second MOS switch of the current source is turned on and operates in a saturation region.

20 Claims, 7 Drawing Sheets

US 7,199,742 B2

DIGITAL-TO-ANALOG CONVERTER AND RELATED LEVEL SHIFTER THEREOF

BACKGROUND OF INVENTION

1. Field of the Invention

The present invention relates to a digital-to-analog converter (DAC) and a level shifter of the DAC thereof, and more particularly to a DAC having a low swing level shifter and the low swing level shifter thereof.

2. Description of the Prior Art

Digital-to-analog converters are used to transfer the digital input signals into analog output signals and are essential in many systems, such as video systems, audio systems, wired communication systems, and wireless communication systems.

There have been many various DAC structures that have applied in many different fields. In high-speed and high-resolution applications, i.e. the data length is greater than 10 bits and the sampling frequency is greater than 1000 Mz, the current-mode DAC structure is a popular choice to convert digital signals into analog signals because it can directly drive resistive load and do not need any output voltage buffer. The current-mode DAC is composed of many current cells, and the finite output impendence of the current cell of the DAC is a key factor to affect the performance of the DAC. The output impendence of the current cell must be high enough to avoid ruining the performance of the DAC.

Please refer to FIGS. 1–2. FIG. 1 is a functional diagram of a current-mode DAC 10 according to the prior art. FIG. 2 is a schematic diagram of a current cell 14 used in the current-mode DAC 10. The current-mode DAC 10 comprises two thermometer decoders 11, 12 and a plurality of current cells 14. The two thermometer decoders 11 and 12 are used to decode the six binary signals B1, B2, B3, B5, B6, and B7 and then to generate and transmit corresponding binary signals, such as the input signals in1, in2, and in3 shown in FIG. 2, to the current cells 14. Each of the current cells 14 can be separated into a core voltage part 16 and an IO voltage part 18. The working voltage of the core voltage part 16 is less than the working voltage of the IO voltage part 18. A local decoder 20 decodes the received binary input signals in1–in3 to control the output of the current cell 14. A clock circuit 22 and a latch circuit 24 are connected between the local decoder 20 and a level shifter 26 of the current cell 14. The level shifter 26 is used to convert a first input signal INP into a second output signal OUTN and to convert a second input signal INN into a first output signal OUTP. A current source 27 outputs corresponding current according the output signals OUTN and OUTP of the level shifter 26. The current source 27 has four PMOS transistors T1, T2, T3, and T4. The PMOS transistors T1 and T2 are cascaded and connected to a first power terminal $V_{DD}$. The gate of the PMOS transistor T3 receives the second output signal OUTN, and the gate of the PMOS transistor T4 receives the first output signal OUTP. Only one of the two PMOS transistors T3 and T4 is turned on at a time so that the current path of the generated current of the current source 27 is controlled. For example, if the first output signal OUTP is high and the second output signal OUTN is low, the PMOS transistor T3 is turned on and the PMOS transistor T4 is turned off, and then the generated current of the current source 27 flows from the first power terminal $V_{DD}$ through the PMOS transistors T1, T2, and T3 to a second power terminal Vss. In addition, the working voltage of the IO voltage part 18 is applied to the first power terminal, and the second power terminal Vss is grounding. Therefore, the voltage level of the first power terminal $V_{DD}$ is greater than the voltage level of the second power terminal Vss.

Please refer to FIGS. 3–4. FIG. 3 is a circuit diagram of the level shifter 26 and the latch circuit 24 shown in FIG. 2, and FIG. 4 is a timing diagram of the two output signals OUTN and OUTP of the level shifter 26. The level shifter 26 has a first module 40 and a second module 42, and the latch circuit 24 has a first inverter 32 and a second inverter 34. The first module 40 of the level shifter 26 is used to convert the first input signal INP into the second output signal OUTN and comprises a NMOS transistor 28, an inverter 36, and a first output unit 44. Similarly, the second module 42 of the level shifter 26 is used to convert the second input signal INN into the first output signal OUTP and comprises a NMOS transistor 30, an inverter 38, and a second output unit 46. The first output unit 44 is an inverter and has a first PMOS transistor 47 and a first NMOS transistor 48. The second output unit 46 is also an inverter and has a second PMOS transistor 49 and a second NMOS transistor 50. The first PMOS transistor 47 and the second PMOS transistor 49 are connected to the first power terminal $V_{DD}$, and the first NMOS transistor 48 and the second NMOS transistor 50 are connected to the second power terminal Vss. Therefore, the voltage gap between the first output signal OUTP and the second output signal OUTN is equal to the working voltage of the IO voltage part 18, i.e. the voltage gap between the first power terminal $V_{DD}$ and the second power terminal Vss, e.g. 2.5 voltages.

It is noted that the first input signal INP and the second input signal INN are complementary signals, and the first output signal OUTP and the second output signal OUTN are complementary signals. The voltage gap between the first input signal INP and the second input signal INN is equal to the working voltage of the core voltage part 16, e.g. 1.2 voltages. If the first signal INP is high and the second input signal INN is low, then the first output signal OUTP is high and the second output signal OUTN is low. Oppositely, if the first signal INP is low and the second input signal INN is high, then the first output signal OUTP is low and the second output signal OUTN is high.

Please refer to FIG. 2 and FIG. 4. Because when the PMOS transistor T3 is turned on and the PMOS transistor T4 is turned off, the voltage level of the first output signal OUTP is equal to $V_{DD}$ and the voltage level of the second output signal OUTN is equal to Vss. Therefore, in such case, the PMOS transistor T3 operates in a linear region. Similarly, when the PMOS transistor T3 is turned off and the PMOS transistor T4 is turned on, the voltage level of the first output signal OUTP is equal to Vss and the voltage level of the second output signal OUTN is equal to $V_{DD}$. Therefore, in this case, the PMOS transistor T4 operates in a linear region. Hence, the output impendence of the current cell 14 is not greater enough to reduce the clock feedthrough effect and the glitch energy.

SUMMARY OF INVENTION

It is therefore a primary objective of the present invention to provide a new digital-to-analog converter (DAC) and a level shifter of the DAC thereof to solve the above mentioned problems.

The DAC has a plurality of current cells. Each of the current cells has a level shifter and a current source. The level shifter connects to a first power terminal and a second power terminal to convert a first input signal and a second input signal into a first output signal and a second output signal. The current source has two cascaded MOS transistors connected to the first power terminal in series, a first MOS switch having a gate for receiving the first output signal, and a second MOS switch having a gate for receiving the second output signal. A voltage level of the first power terminal being greater than a voltage level of the second power terminal. When one of the current cells operates, one of the first MOS switch and the second MOS switch of the current source is turned on and operates in a saturation region. Therefore, the output impendence of each current cell is greater enough to reduce the clock feedthrough effect and to decrease the glitch energy.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
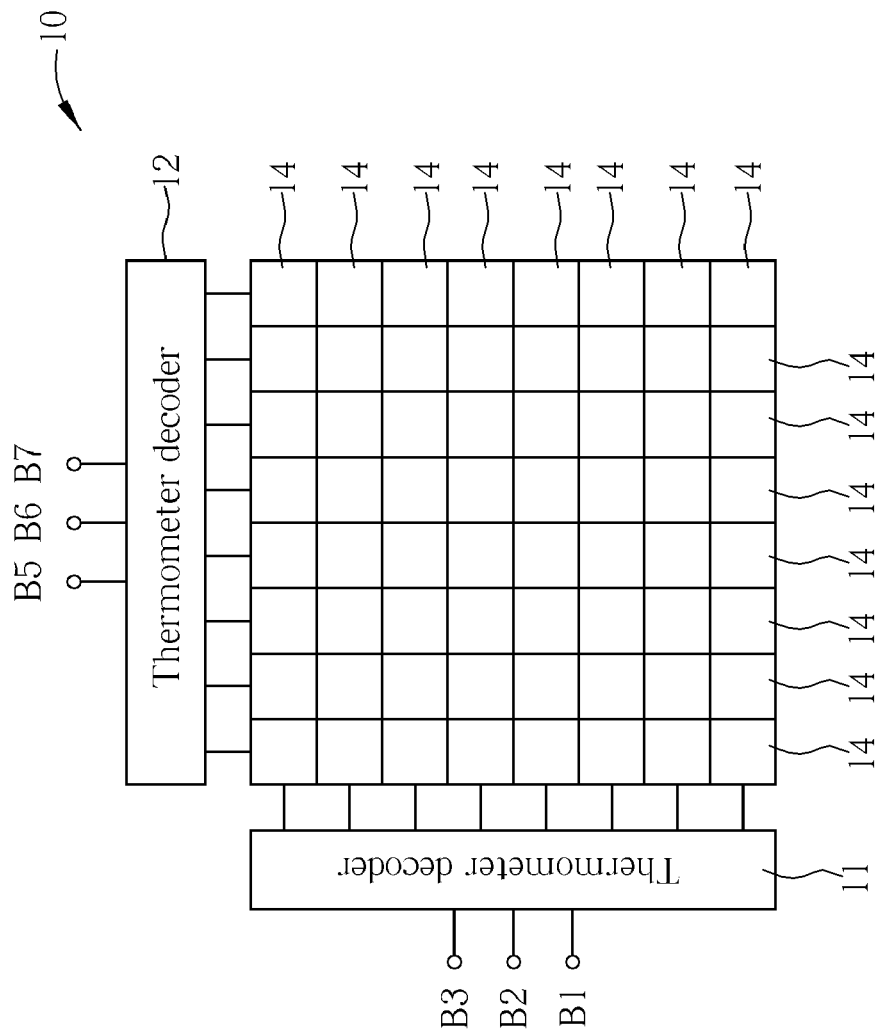
FIG. 1 is a functional diagram of a current-mode DAC according to the prior art.
Figure 2:
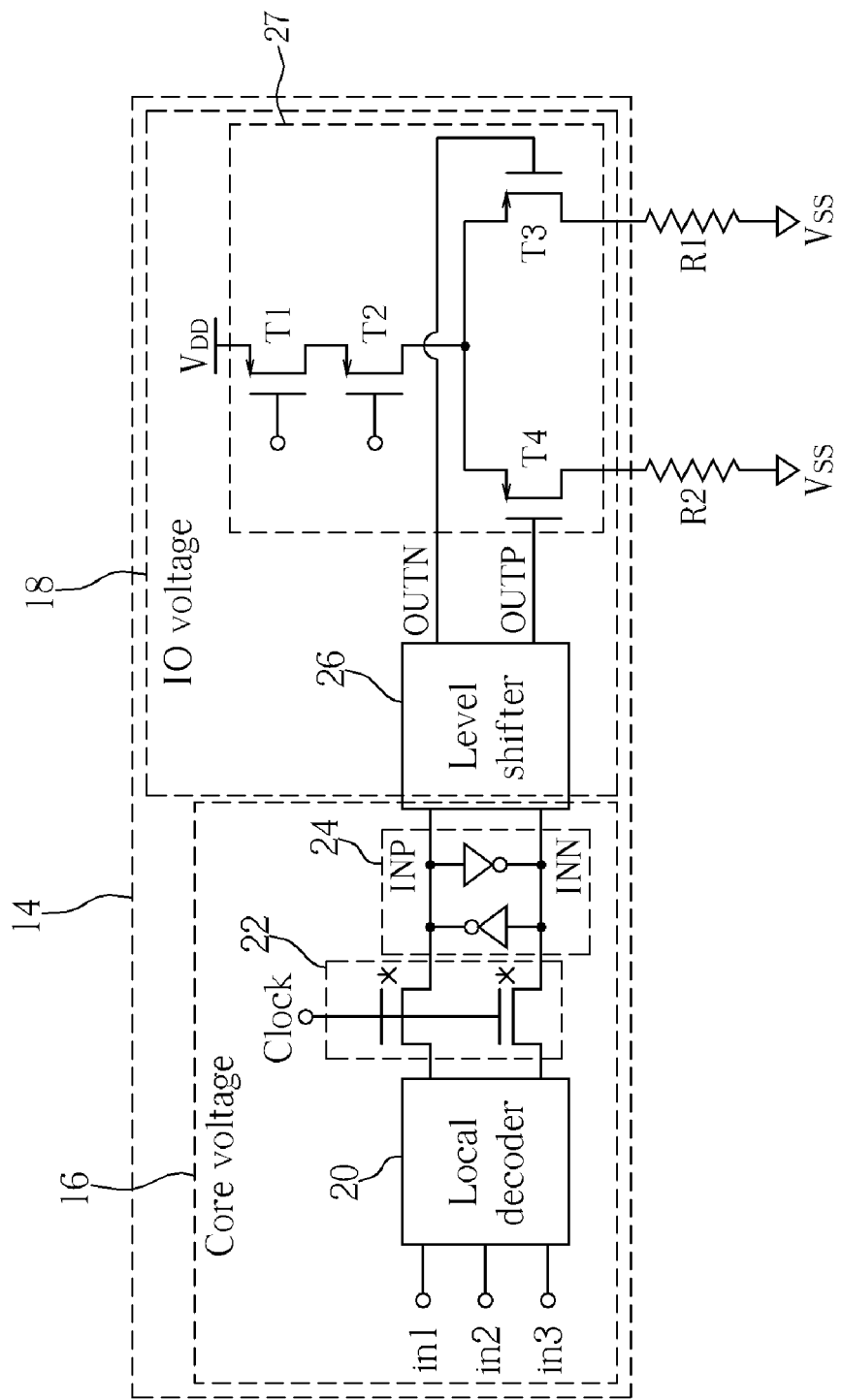
FIG. 2 is a schematic diagram of a current cell used in the current-mode DAC shown in FIG. 1.
Figure 3:
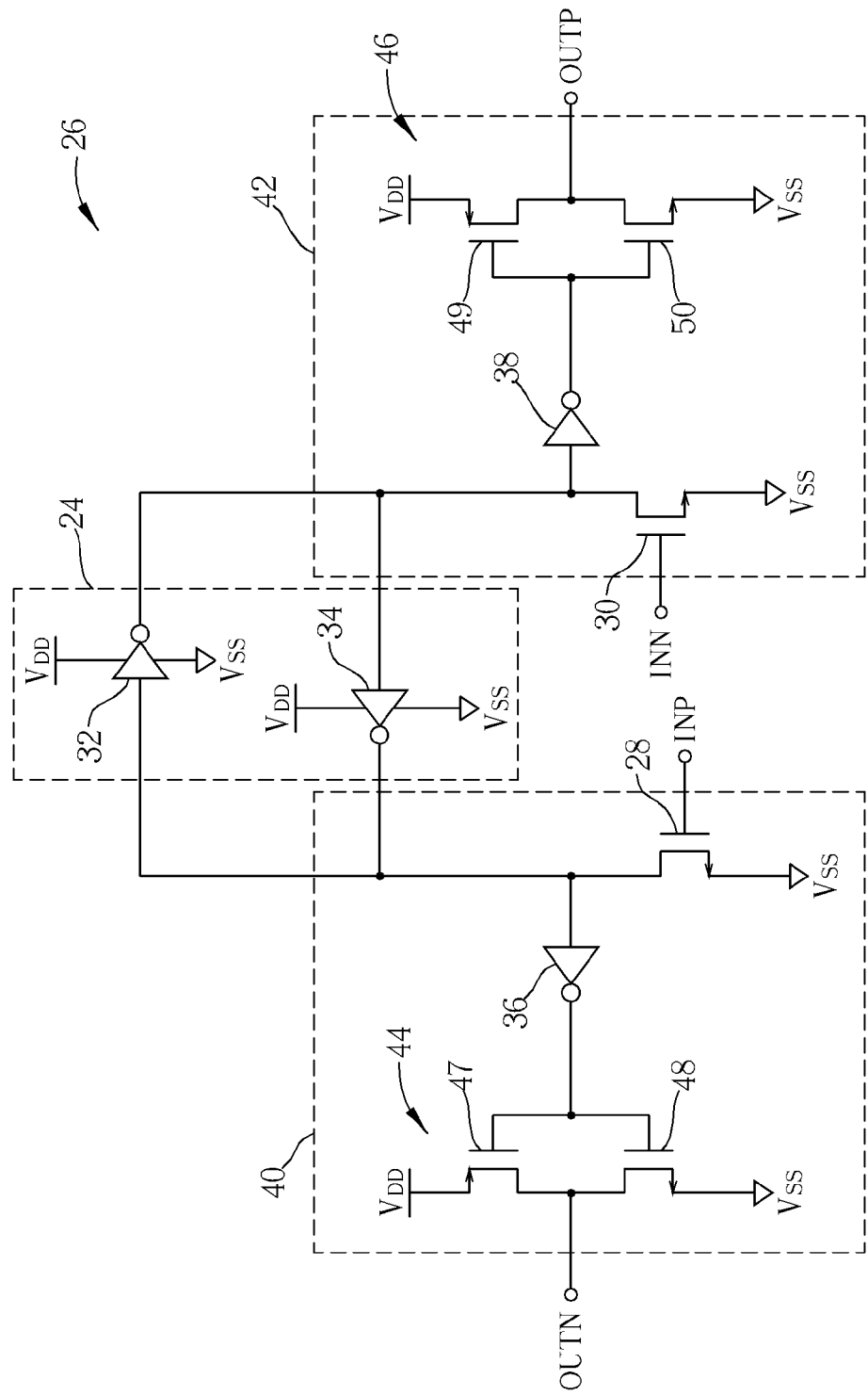
FIG. 3 is a circuit diagram of a level shifter 26 and a latch circuit 24 shown in FIG. 2.
Figure 4:
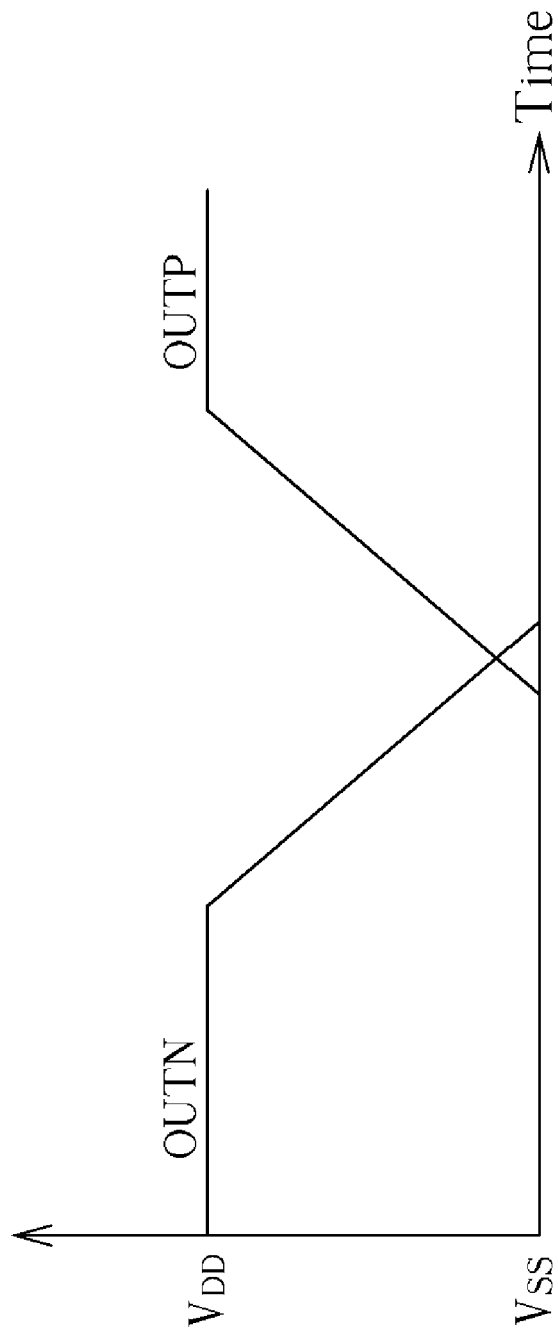
FIG. 4 is a timing diagram of two output signals of the level shifter shown in FIG. 2.
Figure 5:
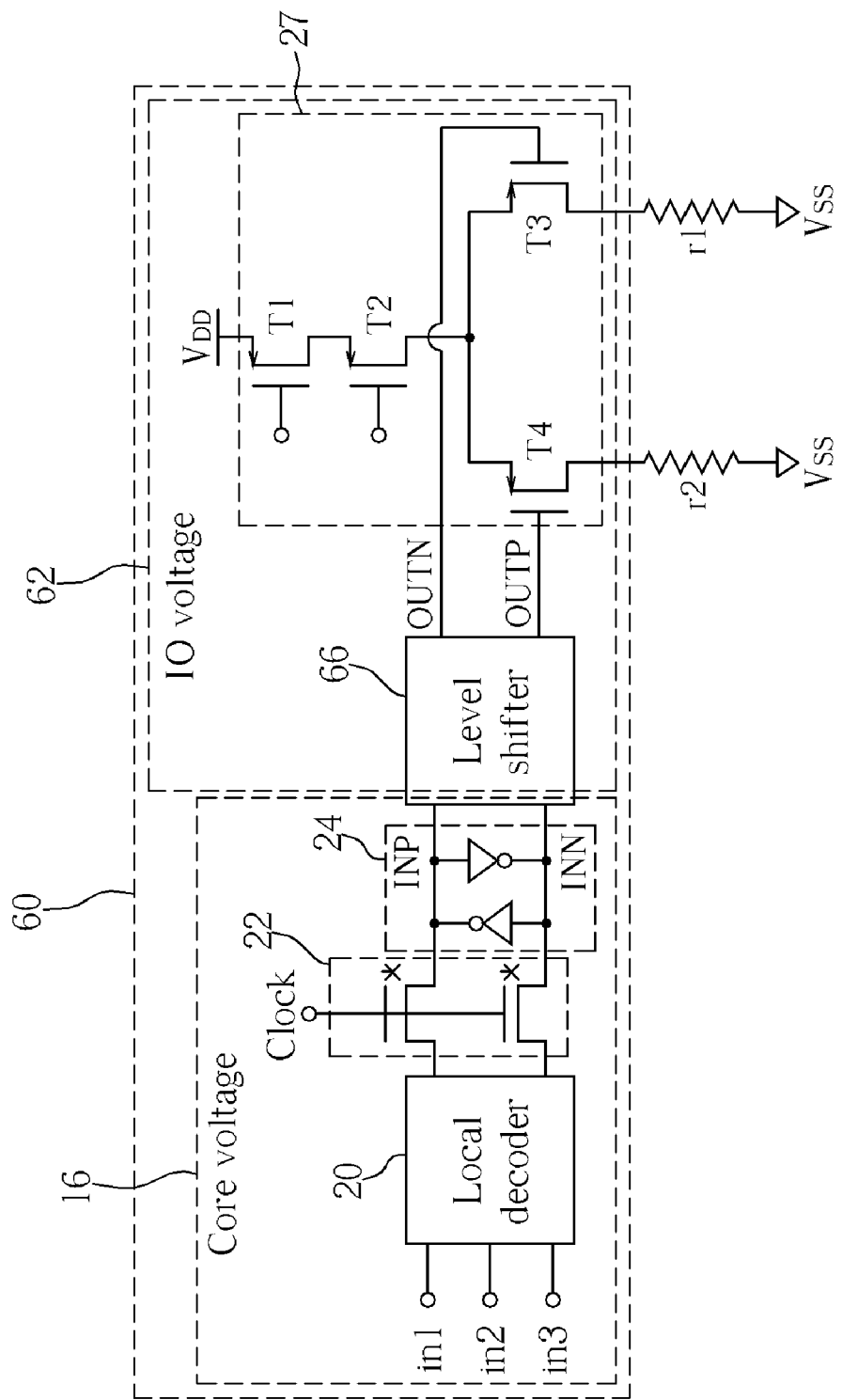
FIG. 5 is a schematic diagram of a current cell used in a current-mode DAC according to the present invention.

Please refer to FIG. 2 and FIG. 5. FIG. 5 is a schematic diagram of a current cell 60 used in a current-mode DAC according to the present invention. The major difference between the current cells 14 and 60 is that a level shifter 66 is used to replace the level shifter 26 of the current cell 14.

Similar to the current cell 14, the current cell 60 is also used in a DAC for converting inputted digital signals into corresponding current. The DAC according to the present invention comprising a plurality of the current cells 60 and is used to convert digital signals into analog signals. Each of the current cells 60 of the DAC can be separated into a core voltage part 16 and an IO voltage part 62. The working voltage of the core voltage part 16 is less than the working voltage of the IO voltage part 62. A local decoder 20 decodes the received binary input signals in1–in3 to control the output of the current cell 60. A clock circuit 22 and a latch circuit 24 are connected between the local decoder 20 and the level shifter 66.

Unlike the level shifter 26, the level shifter 66 is used to convert the first input signal INP into a first output signal OUTP and to convert the second input signal INN into a second output signal OUTN. In addition, the current source 27 of the current cell 60 outputs corresponding current according the output signals OUTN and OUTP. The working voltage of the IO voltage part 62 is applied to the first power terminal, and the second power terminal Vss is grounding. Therefore, the voltage level of the first power terminal $V_{DD}$ is greater than the voltage level of the second power terminal Vss.

Figure 6:
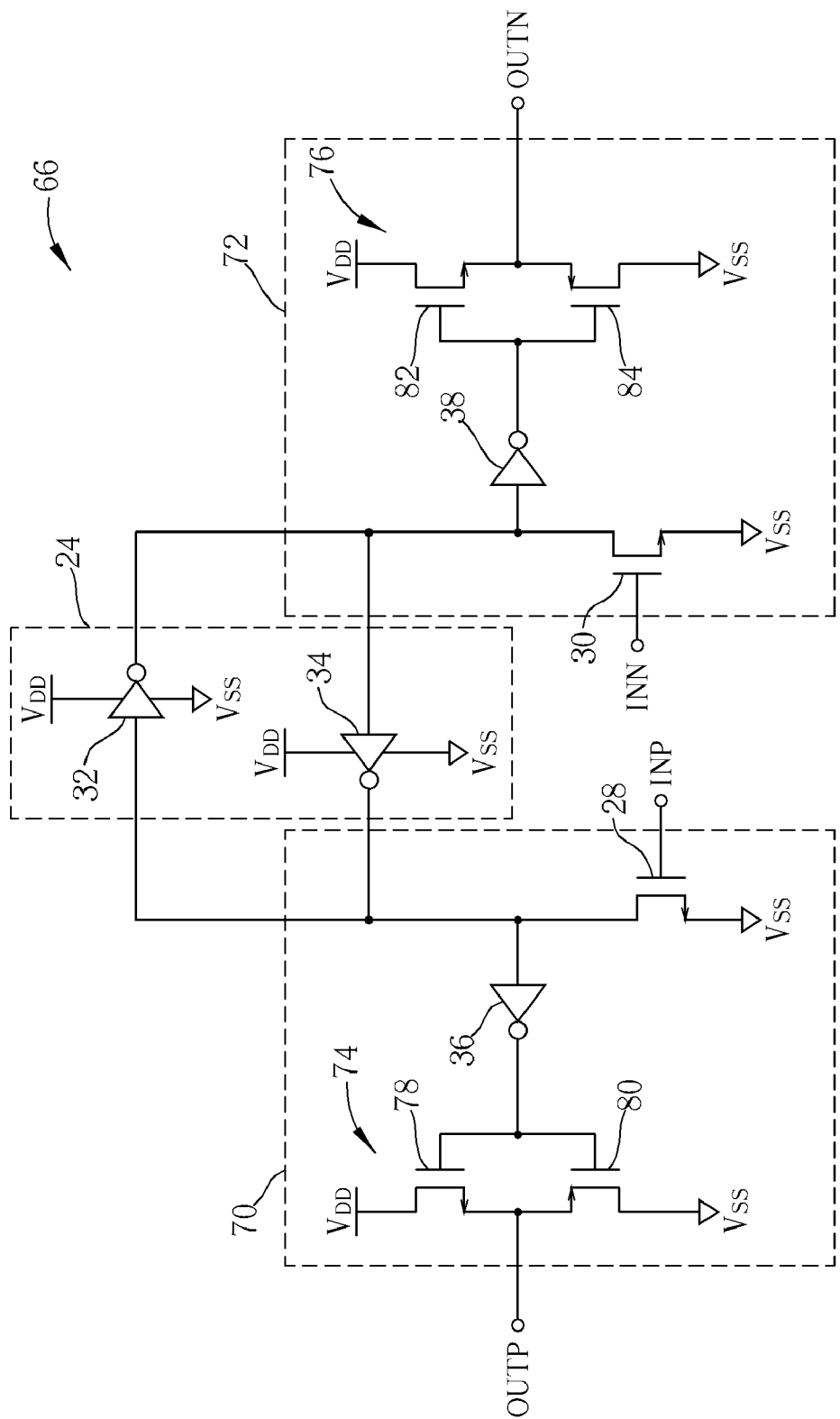
FIG. 6 is a circuit diagram of a level shifter and a latch circuit shown in FIG. 5.
Figure 7:
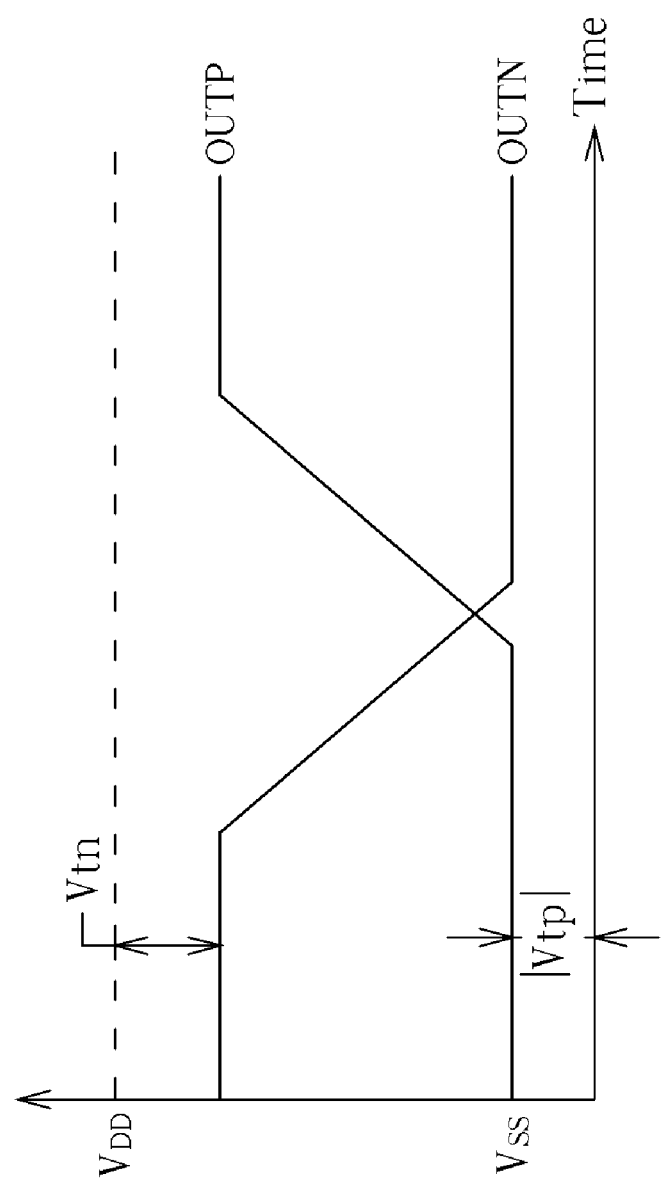
FIG. 7 is a timing diagram of the two output signals OUTN and OUTP of the level shifter shown in FIG. 6.

Please refer to FIGS. 6–7. FIG. 6 is a circuit diagram of the level shifter 66 and the latch circuit 24 shown in FIG. 5.

FIG. 7 is a timing diagram of the two output signals OUTN and OUTP of the level shifter 66. The level shifter 26 has a first module 70 and a second module 72, and the latch circuit 24 has a first inverter 32 and a second inverter 34. The first module 70 of the level shifter 66 is used to convert the first input signal INP into the first output signal OUTP and comprises a NMOS transistor 28, an inverter 36, and a first output unit 74. Similarly, the second module 72 of the level shifter 66 is used to convert the second input signal INN into the second output signal OUTN and comprises a NMOS transistor 30, an inverter 38, and a second output unit 76. The first output unit 74 has a first NMOS transistor 78 and a first PMOS transistor 80, and the second output unit 76 has a second NMOS transistor 82 and a second PMOS transistor 84. The first NMOS transistor 78 and the second NMOS transistor 82 are connected to the first power terminal $V_{DD}$, and the first PMOS transistor 80 and the second PMOS transistor 84 are connected to the second power terminal Vss.

When the first input signal INP is high and the second input signal INN is low, the first NMOS transistor 78 and the second PMOS transistor are turned on and the first PMOS transistor 80 and the second NMOS transistor 82 are turned off. Therefore, in such case the voltage level of the first output signal OUTP is equal to ($V_{DD}$–Vtn) and the voltage level of the second output signal OUTN is equal to (Vss+|Vtp|), where Vtn is the threshold voltage of the NMOS transistors 78, 82 and Vtp is the threshold voltage of the PMOS transistors 80, 84. Compared with the PMOS transistor T3 of the prior art, the PMOS transistor T3 of the present invention operates in a saturation region, and the output impendence of the current cell 60 is almost increased by $g_m r_0$ times, where $g_m$ is the transconductor and $r_0$ is the static output impendence of the PMOS transistor T3. Oppositely, when the first input signal INP is low and the second input signal INN is high, the first NMOS transistor 78 and the second PMOS transistor are turned off and the first PMOS transistor 80 and the second NMOS transistor 82 are turned on. Therefore, in this case the voltage level of the first output signal OUTP is equal to (Vss+|Vtp|) and the voltage level of the second output signal OUTN is equal to ($V_{DD}$–Vtn). Compared with the PMOS transistor T4 of the prior art, the PMOS transistor T4 of the present invention operates in a saturation region, and the output impendence of the current cell 60 is almost increased by $g_m r_0$ times. Therefore, the output impendence of each current cell 60 is greater enough to reduce the finite output resistance effect of the current source and to decrease the glitch energy.

Compared with the prior art, the swing of the level shifter is smaller and the turned on PMOS transistor of a current source of a current cell of the DAC according to the present invention operates in the saturation region. The output impendence of each current cell of the DAC is increased, so the finite output resistance effect of the current source is reduced and the glitch energy is decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-to-analog converter (DAC) comprising a plurality of current cells, and each of the current cells comprising:
   a level shifter connected to a first power terminal and a second power terminal for converting a first input signal and a second input signal into a first output signal and a second output signal, the level shifter comprising:
a first module for converting the first input signal into the first output signal having a first NMOS transistor coupled to the first power terminal and a first PMOS transistor coupled to the second power terminal; and
a second module for converting the second input signal into the second output signal having a second NMOS transistor coupled to the first power terminal and a second NMOS transistor coupled to the second power terminal; and
a current source connected to the first power terminal and the second power terminal, the current source comprising:
two cascaded MOS transistors connected to the first power terminal in series;
a first MOS switch having a gate connected to the first module for receiving the first output signal; and
a second MOS switch having a gate connected to the second module for receiving the second output signal;
wherein the first power terminal supplies a digital high voltage level and the second power terminal supplies a digital low voltage level.

2. The DAC of claim 1 wherein when one of the current cells operates, one of the first MOS switch and the second MOS switch of the current source is turned on and operates in a saturation region.

3. The DAC of claim 1 wherein the first MOS switch and the second switch are PMOS transistors.

4. The DAC of claim 1 wherein the first input signal and the second input signal are complementary signals, and the first output signal and the second output signal are complementary signals.

5. The DAC of claim 1 wherein a voltage level of the first power terminal is greater than a voltage level of the second power terminal, and a voltage gap between the first output signal and the second output signal is less than a voltage gap between the first power terminal and the second power terminal and greater than a voltage gap between the first input signal and the second input signal.

6. The DAC of claim 1 wherein when a voltage level of the first input signal is greater than a voltage level of the second input signal, a voltage level of the second output signal is greater than a voltage level of the second power terminal, and a difference between the voltage level of the second output signal and the voltage level of the second power terminal is greater than or equal to a absolute value of a threshold voltage of the second PMOS transistor.

7. The DAC of claim 1 wherein when a voltage level of the first input signal is less than a voltage level of the second input signal, a voltage level of the first output signal is greater than a voltage level of the second power terminal, and a difference between the voltage level of the first output signal and the voltage level of the second power terminal is greater than or equal to a absolute value of a threshold voltage of the first PMOS transistor.

8. A digital-to-analog converter (DAC) comprising a plurality of current cells, and each of the current cells comprising:
a level shifter connected to a first power terminal and a second power terminal for converting a first input signal and a second input signal into a first output signal and a second output signal, a voltage level of the first power terminal being greater than a voltage level of the second power terminal; and a current source connected to the first power terminal and the second power terminal, the current source comprising:
two cascaded MOS transistors connected to the first power terminal in series;
a first MOS switch having a gate for receiving the first output signal; and
a second MOS switch having a gate for receiving the second output signal;
wherein when one of the current cells operates, one of the first MOS switch and the second MOS switch of the current source is turned on and operates in a saturation region,
wherein the first power terminal supplies a digital high level and the second power terminal supplies a digital low voltage level.

9. The DAC of claim 8 wherein the first MOS switch and the second switch are PMOS transistors.

10. The DAC of claim 8 wherein the first input signal and the second input signal are complementary signals, and the first output signal and the second output signal are complementary signals.

11. The DAC of claim 8 wherein the level shifter comprising:
a first module for converting the first input signal into the first output signal having a first NMOS transistor coupled to the first power terminal and a first PMOS transistor coupled to the second power terminal; and
a second module for converting the second input signal into the second output signal having a second NMOS transistor coupled to the first power terminal and a second PMOS transistor coupled to the second power terminal;
wherein a voltage gap between the first output signal and the second output signal is less than a voltage gap between the first power terminal and the second power terminal and greater than a voltage gap between the first input signal and the second input signal.

12. The DAC of claim 11 wherein when a voltage level of the first input signal is greater than a voltage level of the second input signal, a voltage level of the second output signal is greater than the voltage level of the second power terminal, and a difference between the voltage level of the second output signal and the voltage level of the second power terminal is greater than or equal to a absolute value of a threshold voltage of the second PMOS transistor.

13. The DAC of claim 11 wherein when a voltage level of the first input signal is less than a voltage level of the second input signal, a voltage level of the first output signal is greater than the voltage level of the second power terminal, and a difference between the voltage level of the first output signal and the voltage level of the second power terminal is greater than or equal to a absolute value of a threshold voltage of the first PMOS transistor.

14. A level shifter for converting a first input signal and a second input signal into a first output signal and a second output signal, the level shifter comprising:
a first module connected to a first power terminal and a second power terminal for converting the first input signal into the first output signal, the first module having a first NMOS transistor coupled to the first power terminal and a first PMOS transistor coupled to the second power terminal; and
a second module connected to the first power terminal and the second power terminal for converting the second input signal into the second output signal, the second module having a second NMOS transistor coupled to the first power terminal and a second PMOS transistor coupled to the second power terminal;

wherein the first power terminal supplies a digital high voltage level and the second power terminal supplies a digital low voltage level, a voltage gap between the first output signal and the second output signal is less than a voltage gap between the first power terminal and the second power terminal and greater than a voltage gap between the first input signal and the second input signal.

15. The level shifter of claim 14 wherein the first input signal and the second input signal are complementary signals, and the first output signal and the second output signal are complementary signals.

16. The level shifter of claim 14 wherein when a voltage level of the first input signal is greater than a voltage level of the second input signal, a voltage level of the second output signal is greater than the voltage level of the second power terminal, and a difference between the voltage level of the second output signal and the voltage level of the second power terminal is greater than or equal to a absolute value of a threshold voltage of the second PMOS transistor.

17. The level shifter of claim 14 wherein when a voltage level of the first input signal is less than a voltage level of the second input signal, a voltage level of the first output signal is greater than the voltage level of the second power terminal, and a difference between the voltage level of the first output signal and the voltage level of the second power terminal is greater than or equal to a absolute value of a threshold voltage of the first PMOS transistor.

18. The DAC of claim 1 wherein the second power terminal supplies a ground voltage level.

19. The DAC of claim 8 wherein the second power terminal supplies a ground voltage level.

20. The level shifter of claim 14 wherein the second power terminal supplies a ground voltage level.

* * * * *